United States Patent [19]
Colombani

[11] Patent Number: 5,829,658
[45] Date of Patent: *Nov. 3, 1998

[54] METHOD AND DEVICE FOR CARRYING OUT THE CLEAVAGE IN ULTRA-HIGH VACUUM ENVIRONMENT OF PORTIONS OF A PROCESSED SEMICONDUCTOR WAFER

[75] Inventor: Luigi Angelo Colombani, Milan, Italy

[73] Assignee: Alcatel N.V., Rijswijk, Netherlands

[ * ] Notice: This patent issued on a continued prosecution application filed under 37 CFR 1.53(d), and is subject to the twenty year patent term provisions of 35 U.S.C. 154(a)(2).

[21] Appl. No.: 646,587

[22] Filed: May 8, 1996

[30] Foreign Application Priority Data

May 22, 1995 [IT] Italy ................................. MI95A1036

[51] Int. Cl.$^6$ ............................. B26F 3/00; H01L 21/301
[52] U.S. Cl. .................................. 225/1; 225/2; 225/96.5; 225/103; 125/23.01; 438/33
[58] Field of Search ................................. 125/23.01, 40; 225/2, 96.5, 103, 97; 83/582, 586, 587, 686, 693; 438/26, 28, 33; 29/413

[56] References Cited

U.S. PATENT DOCUMENTS

| | | | |
|---|---|---|---|
| 1,260,264 | 3/1918 | Huszar | 125/23.01 |
| 3,149,765 | 9/1964 | Horning et al. | 225/2 |
| 3,297,015 | 1/1967 | Crawford | 125/23.01 |
| 3,790,051 | 2/1974 | Moore | 225/103 |
| 4,044,937 | 8/1977 | Hill et al. | 225/96.5 |
| 4,068,788 | 1/1978 | Gubitose et al. | 225/96.5 |
| 4,248,369 | 2/1981 | Clausen | 225/96.5 |
| 5,042,352 | 8/1991 | Lux | 83/690 |
| 5,154,333 | 10/1992 | Bauer et al. | 225/96.5 X |

FOREIGN PATENT DOCUMENTS

| | | | |
|---|---|---|---|
| 16610 | 1/1989 | Japan | 125/23.01 |
| 1373201 | 11/1974 | United Kingdom | 83/582 |
| 2038163 | 7/1980 | United Kingdom | 83/586 |
| 9304497 | 3/1993 | WIPO . | |

OTHER PUBLICATIONS

"Vacuum Compatible Laser Bar Cleaver", *IBM Technical Disclosure Bulletin*, vol. 36, No. 06A, Jun. 1993, pp. 229–230.
Patent Abstracts of Japan No. JP1166593 Jun. 30, 1989 and Japanese Patent Application JP 870326453 Dec. 22, 1987.
Patent Abstracts of Japan JP 4348909 Dec. 03, 1992 and Japanese Patent Application JP 910029044 Jan. 31, 1991.

*Primary Examiner*—Eugenia Jones
*Attorney, Agent, or Firm*—Ware, Fressola, Van Der Sluys & Adolphson LLP

[57] ABSTRACT

A method and a device are provided for obtaining semiconductor bars for laser devices starting from portions of a processed wafer and carrying out the cleavage in ultra-high-vacuum. The cleavage mechanical stresses are impulsive forces and are all applied from the processed side of the wafer through a lowerable shaped member actuated by compressed helical springs, which applies these stresses on the ledging parts of the wafer portion held on a central region thereof by a fixed support and held down in position by a suitably shaped centering thrust member. The spring-up occurs by translating the device in the ultra-high-vacuum environment and opposing a locking lever engaging the lowerable member in an upper or first position with a fixed cam.

12 Claims, 6 Drawing Sheets

METHOD AND DEVICE FOR CARRYING OUT THE CLEAVAGE IN ULTRA-HIGH VACUUM ENVIRONMENT OF PORTIONS OF A PROCESSED SEMICONDUCTOR WAFER

TECHNICAL FIELD

The present invention relates to a method of obtaining bars for semiconductor laser devices through cleavage in ultra-high vacuum from portions of a processed semiconductor wafer and to a device for implementing such a method.

BACKGROUND OF THE INVENTION

The cleavage of processed semiconductor wafer portions into bars on which an aligned array of semiconductor lasers are located must be carried out in an ultra-high vacuum environment since it is necessary to protect the cleavage specular surfaces against the polluting substances present in the atmosphere in order to be able to carry out successfully the subsequent steps for stable protection (passivation) of the specular surfaces.

The cleavage of the basic semiconductor crystal forming the processed wafer, occurring along crystal lattice planes has to produce surfaces as perfect as possible. Such a need derives from a precise constructive requirement for RIDGE and BURIED laser sources. For such families of sources, the cleavage surfaces automatically create the reflecting termination of the small Fabry-Perot resonant cavities that intervene in the phenomenon of "stimulated emission" and "amplification" of the generated and emitted radiation.

Figure 1A:
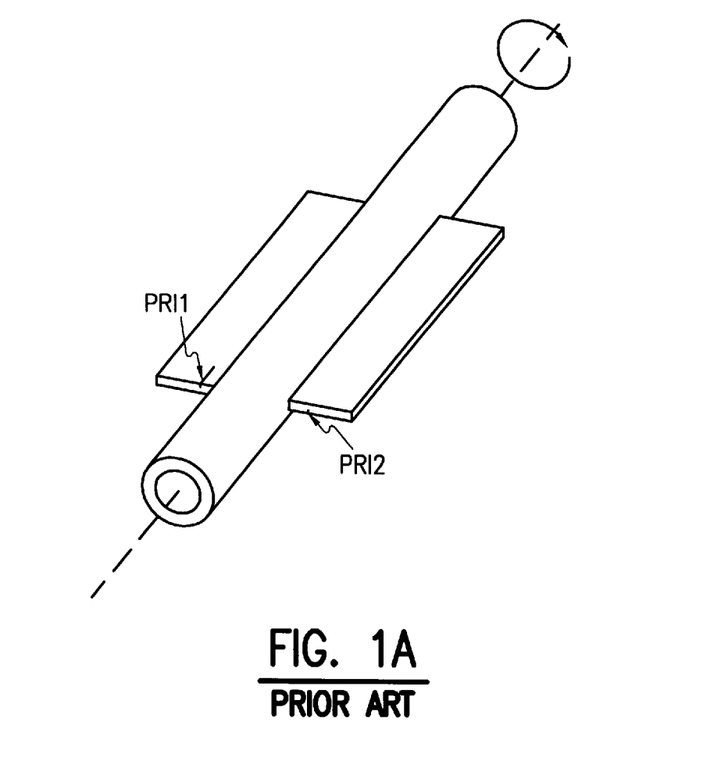
FIG. 1A shows a wafer-shaft assembly according to the prior art.
Figure 1B:
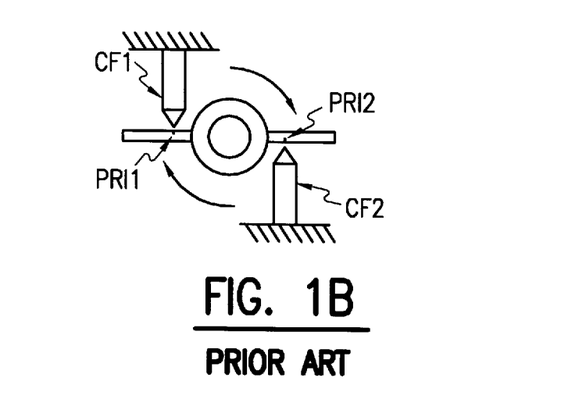
FIG. 1B illustrates schematically a cleavage process to obtain bars from processed wafer portions in ultra-high-vacuum as known in the art.

Conventionally, the above-mentioned cleavage in ultra-high-vacuum is carried out by symmetrically engaging the wafer portion to be cleaved on a shaft rotating about its axis as shown in FIG. 1A. By rotating the wafer-shaft assembly at a slow rate, the ledging parts of the semiconductor are forced against two fixed cutters CF1, CF2 as shown in FIG. 1B, thus performing the cleavage operation. Once the cleavage has occurred, the portion engaged on the shaft, and the consequent specular surfaces, are ready for subsequent treatments.

However, it is to be noticed that rotation of the wafer-shaft assembly involves a sophisticated vacuum-tight feed-through between atmospheric and ultra-high vacuum environments.

Moreover, a semiconductor wafer is processed on one of its sides only and so are its portions. The cleavage operation is facilitated and spatially well defined through one or more pre-notchings PRI1, PRI2 in FIGS. 1A and 1B) in the direction in which the mechanical stress is applied. In the prior art system as illustrated in FIGS. 1A and 1B, the pre-notchings must necessarily be carried out on the opposite side too and this involves the "manipulation" of both the front side and the back side of the wafer which, beside being a complication, involves the high probable risk of damaging mechanically one or more devices located on the processed side and this is highly undesirable.

DISCLOSURE OF THE INVENTION

The object of the present invention is to eliminate the drawbacks of the known art.

According to one aspect of the invention there is provided a method of obtaining bars for semiconductor laser devices through cleavage in ultra-high-vacuum from portions of a processed wafer wherein the portion of wafer is held steady and the cleavage mechanical stresses are applied simultaneously and impulsively in the same direction from the processed side of the wafer portion.

According to another aspect of the invention, there is provided a mechanical device for the cleavage of a processed wafer portion in high-vacuum comprising a fixed support for holding the wafer portion in its central region corresponding to the bar to be obtained while the side regions overhang as ledges, which support is mounted on a metal disc, a centering thrust member superposable on the fixed support and designed to center and hold down in position the wafer portion, and a cleaving member movable from an upper position above the wafer portion to a lower position below the wafer portion and designed to apply, during its travel, mechanical stresses along the cleavage lines individualized by pre-notchings made on the processed side of the wafer portion.

Through this device designed to implement the above-mentioned method, the problem of obtaining vacuum-tightness between atmospheric environment and ultra-high vacuum environment is solved and, further, the damaging of an aligned array of semiconductor laser located on the processed side of the wafer portion is avoided since the pre-notchings are made on this processed side only and therefore there is no more need for manipulating the wafer from the back side.

These and other objects, features and advantages of the present invention will becomes more apparent in light of the detailed description of a best mode embodiment thereof, as illustrated in the accompanying drawing.

BEST MODE FOR CARRYING OUT THE INVENTION

Figure 2A:
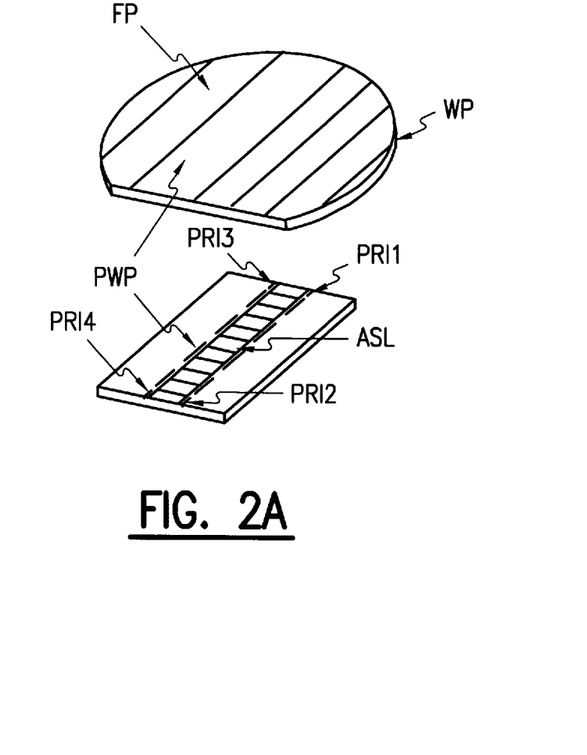
FIG. 2A shows preliminary operations to obtain processed wafer portions, according to the present invention.

Referring now to the figures in detail, FIG. 2A shows the preliminary operations to obtain processed wafer portions.

We begin with a semiconductor wafer WP which has been processed on one side only in a known and conventional way thus obtaining a processed side FP.

From this processed wafer, still in a known and conventional way, portions PWP of processed wafer are obtained on the edges of which pre-notches PRI1 to PRI4 are made from the processed side externally to an aligned array of semiconductor lasers ASL and designed to facilitate and spatially define the cleavage operation.

Figure 2B:
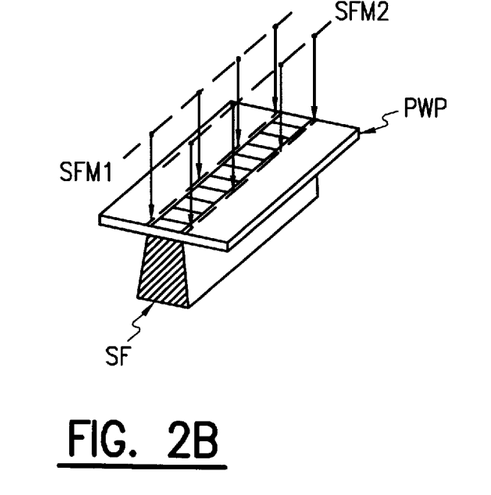
FIG. 2B shows cleavage-impulsive mechanical stresses simultaneously applied from the processed side and perpendicularly thereto in correspondence with cleavage lines defined by pre-notches, according to the present invention.

The cleavage steps in accordance with the invention are diagrammed in FIG. 2B.

The processed wafer portion is held in its central region corresponding to the bar to be obtained, while the side regions overhang as ledges.

Figure 2C:
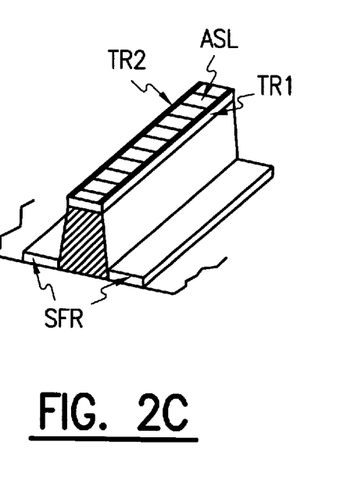
FIG. 2C shows a bar obtained according to the cleavage method shows in FIG. 2B with its two reflecting terminals TR1, TR2, while the ledging parts form swarfs SFR following the cleavage, according to the present invention.

Then an ultra-high-vacuum environment ($10^{-8}$ to $10^{-9}$ TORR) is created and cleavage impulsive mechanical stresses SFM1, SFM2 are simultaneously applied from the processed side and perpendicularly thereto, in correspondence with the cleavage lines defined by the pre-notches, thus obtaining the bar shown in FIG. 2C with its two reflecting terminals TR1, TR2, while the ledging parts form the swarfs SFR following the cleavage.

The mechanical device designed to perform the cleavage steps with the method according to the invention in a preferred embodiment thereof will now be described with reference to FIGS. 3 to 5 bearing in mind that like reference numerals refer to like parts throughout the various views.

Figure 3:
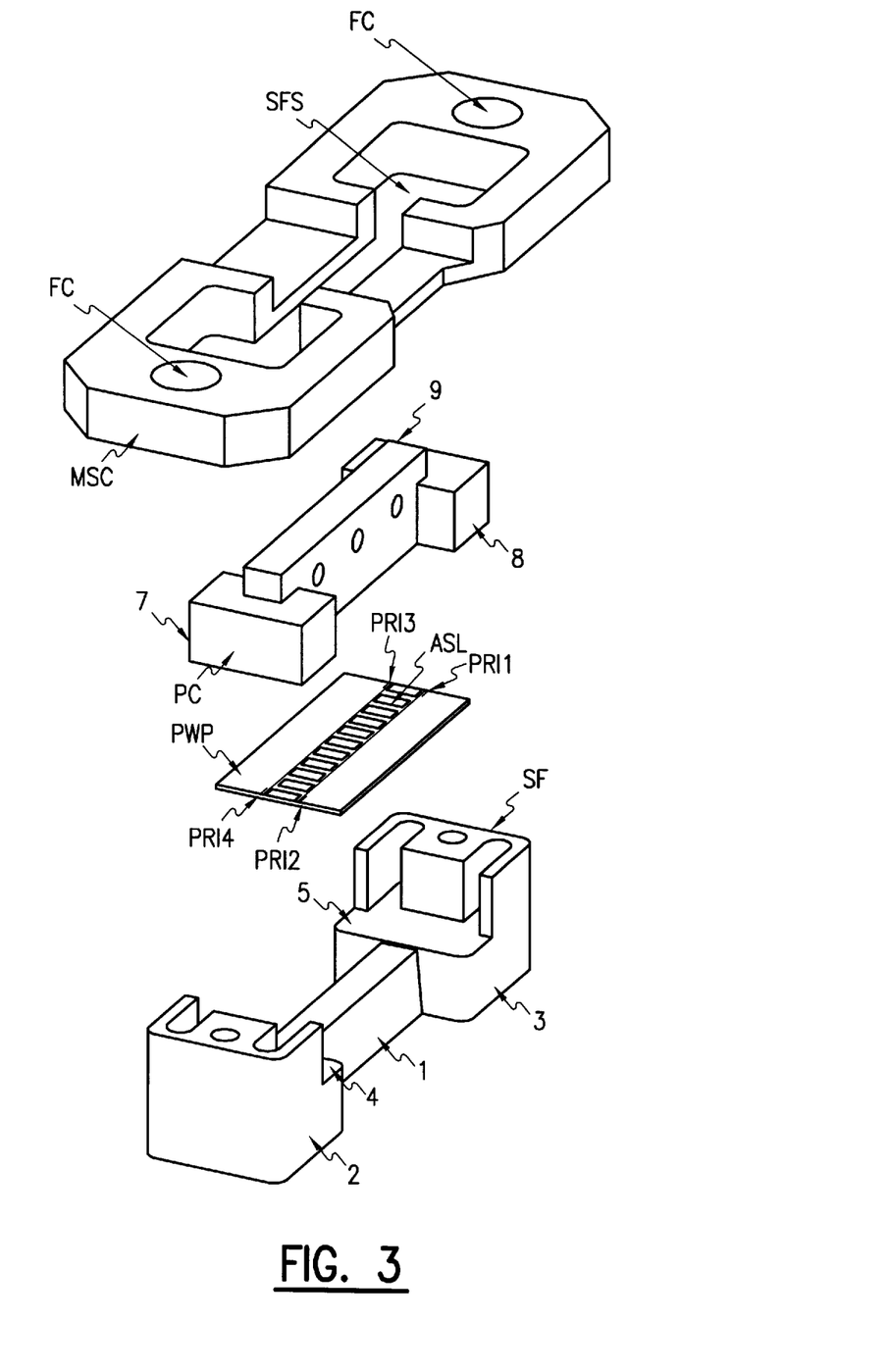
FIG. 3 is an exploded axonometric partial view of a mechanical device for carrying out the cleavage operations illustrated in FIGS. 2A–2C.
Figures 4A, 4B:
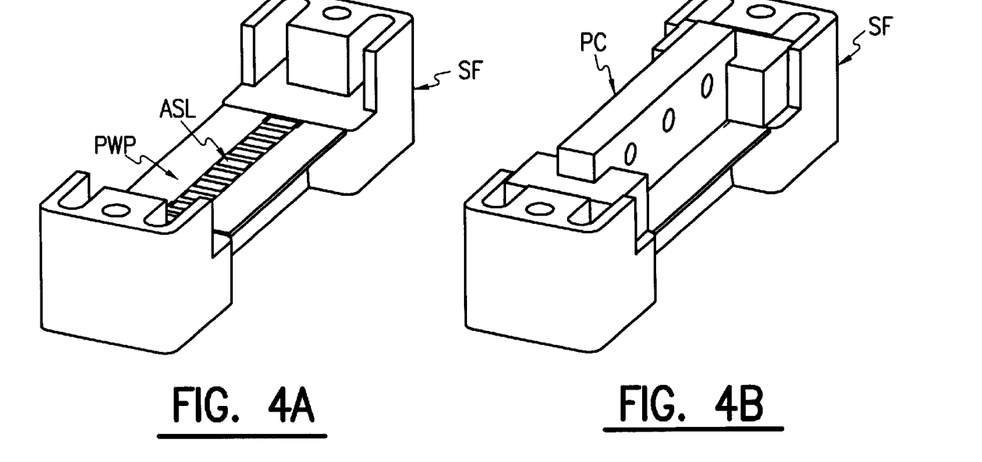
FIG. 4A shows the processed wafer portion PWP, already pre-notched, positioned on the fixed support SF with an aligned array of semiconductor lasers ASL pointing upwards, according to the present invention.
FIG. 4B shows a centering thrust member PC then overlapped which center and holds down in position the wafer portion, thanks to its weight and its mating with the support SF.
Figure 4C:
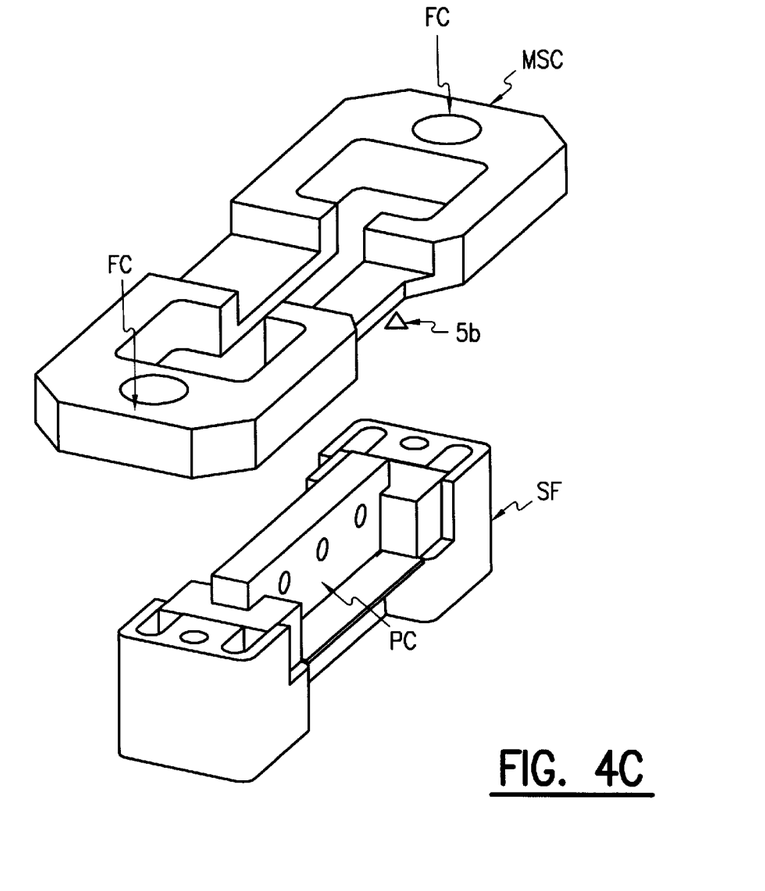
FIG. 4C shows the cleaving member MSC subsequently brought to its upper or start of travel position, as also illustrated in FIG. 5B.

FIG. 3 illustrates partially in an exploded axonometric view the cleavage device in accordance with the invention. Therein a fixed support SF is designed to hold the processed wafer portion PWP at its central region defined by pre-notches PRI1 to 4, a centering thrust member PC designed to center and hold the processed wafer portion PWP in position on the fixed support SF, and a cleaving member MSC for applying the cleavage mechanical stresses.

The fixed support SF is formed by a cross piece 1 having a trapezoidal cross section whose upper surface containing the upper side of the trapezoid has the same dimension as the bar to be obtained. Provided at the ends of the cross piece 1 are two prismatic blocks 2,3 rigidly fixed thereto and suitably shaped.

Machined on the upper side of them are respective horizontal flares substantially double-U shaped with the openings facing each other and whose bottom surfaces 4,5 define a supporting plane slightly raised above the upper side of the cross piece 1 so as to create two steps at its ends.

The centering thrust member PC is formed by a rectangular cross piece 9 whose lower side has the same dimension as the upper side of cross piece 1. Provided at its ends are two prismatic blocks 7,8 fittable in the respective flares 4,5 of the fixed support.

It (PC) is thus coherent with the support and has such a mass that it does not require further bonds.

Figure 4D:
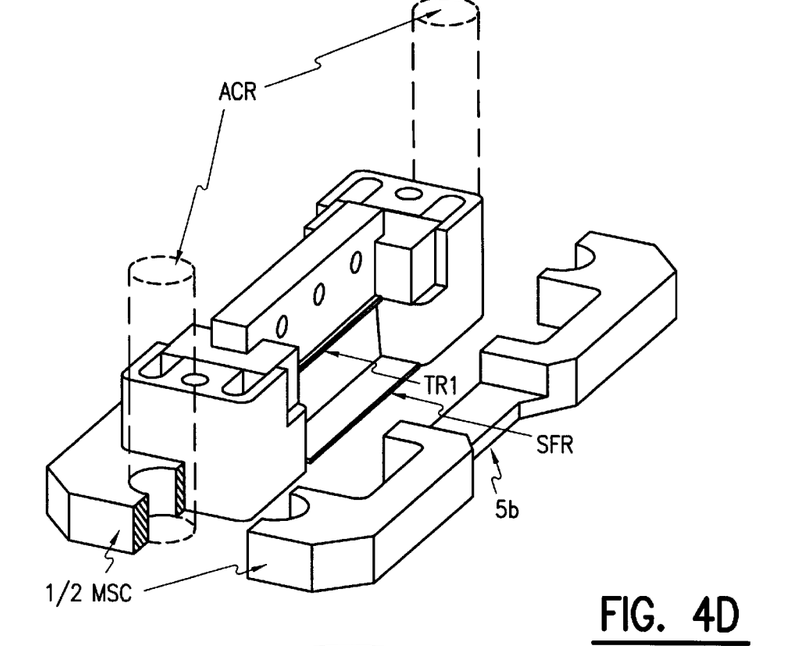
FIG. 4D shows the cleaving member MSC in cutaway view to illustrate the execution of the cleavage.

The cleaving member MSC comprises a plate provided with a window SFS shaped to mate precisely with fixed support (see also FIG. 4D). It is further provided with two calibrated holes FC through which two precision-ground cylindrical guide shafts ACR are passed, as indicated by a dashed line in FIG. 4D.

Figure 5A:
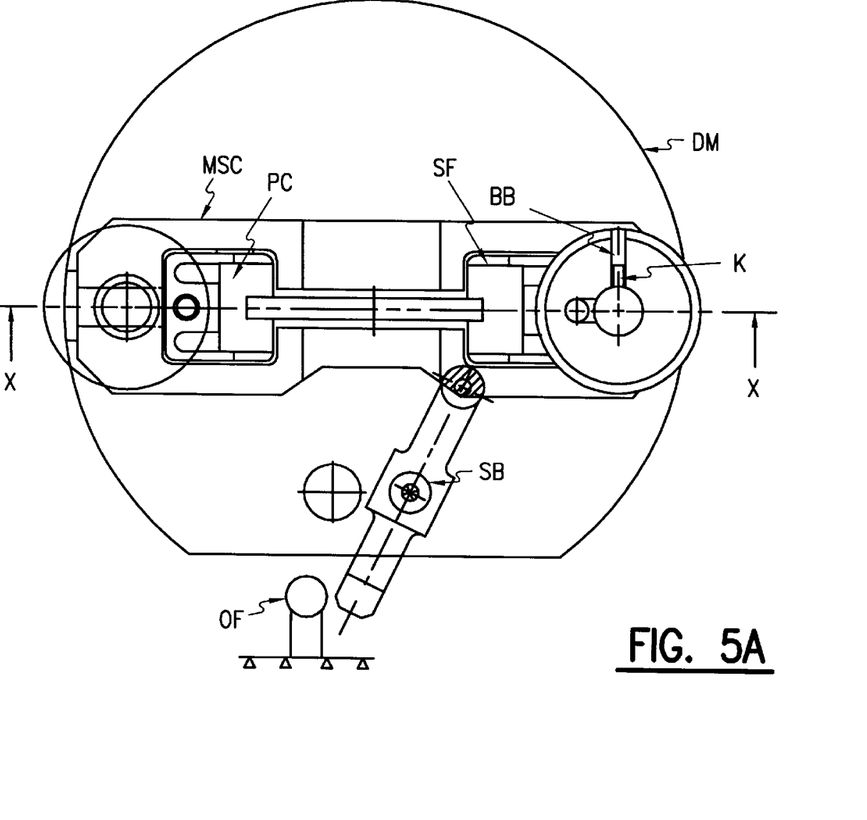
FIG. 5A illustrates, in a top plan view, the device of the invention assembled and ready for carrying out the cleavage in ultra-high-vacuum environment.
Figure 5B:
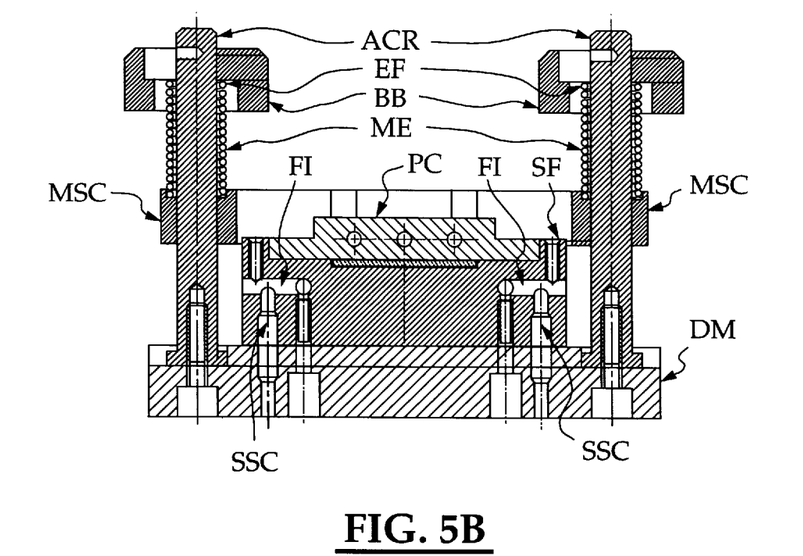
FIG. 5B is a cross-sectional view taken at line X—X of FIG. 5A of the device in a compressed position.
Figure 5C:
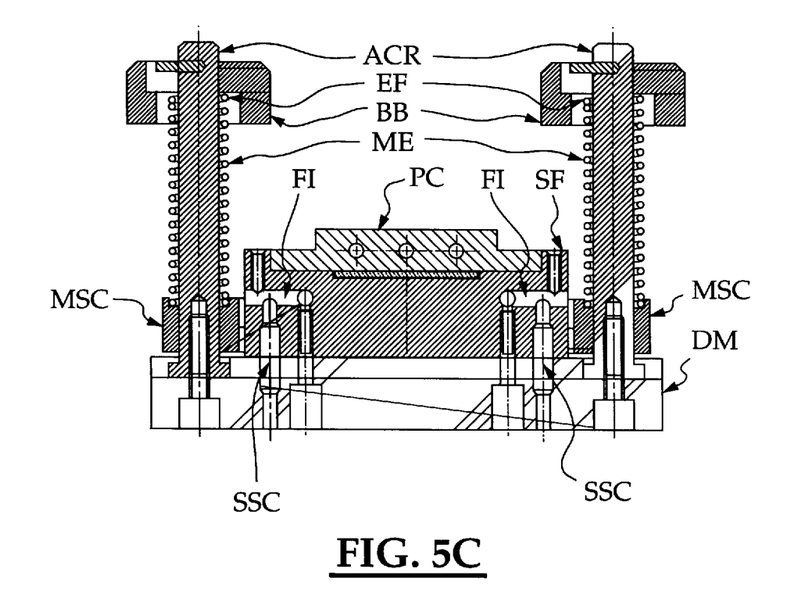
FIG. 5C is a cross-sectional view of the device in a released position.

FIGS. 5A and 5B illustrate the whole device assembled in accordance with the invention.

The fixed support SF is mounted on a base metal disc DM preferably having the same pattern and the diameter as the wafer WP as shown in FIG. 2A. Fixed to the same disc DM are two precision ground cylindrical shafts ACR designed to guide the cleaving member during its travel. Mounted on the shafts are respective helical springs ME whose mobile end abuts on the upper side of the cleaving member and whose fixed end EF (FIG. 5B) abuts on a respective bushing BB keyed with key K on respective shaft ACR and rigidly fixed to the free upper end of the shaft, e.g. by 90 degrees rotation.

Mounted on the disc DM is a locking arrangement SB for the cleaving member MSC. It comprises a lever (FIG. 5A) rotatably pivoted at its center on disc DM, with one end capable of engaging beneath the cleaving member MSC thus locking the latter in its upper position (see FIG. 4C).

FIG. 5B also shows seats SSC for centering pins and special allowance borings FI designed to create blow-off for aeriform substances encased in the threaded holes and in other anfractuosities such as to delay the obtainment of the ultra-high-vacuum condition.

The operation of the above mainly structural description of the device according to the invention will be described with reference to FIGS. 4A to 4D and 5B.

First of all, the processed wafer portion PWP, already pre-notched, is positioned on the fixed support SF with the aligned array of seimconductor lasers ASL pointing upwards (FIG. 4A). Then the centering thrust member PC is superimposed on the wafer portion which centers and holds down in position the wafer portion thanks to its weight and coherence with the support (FIG. 4B) for mating therewith.

Subsequently the cleaving member MSC is brought to its upper or start-of-travel position (FIG. 5B) thus loading the helical springs ME and locked in this position by rotating the lever SB (FIGS. 4C and 5A). The arrow labelled "sb" in FIG. 4C shows the point where the element SB in FIG. 5A engages the cleaving member (MSC).

All these steps (4A to 4C) are carried out in atmospheric environment.

At this point the device is ready to spring up for executing the cleavage and therefore it is put into ultra-high-vacuum environment, where by acting, suitably from the inside, on the lever SB the cleaving member MSC is released which, being keyed with high precision on the precision ground shafts ACR and pushed by springs ME, quickly reaches its end-of-travel position on the common plane with the fixed support thus executing the cleavage.

This operation is shown in FIGS. 4D and 5B. In FIG. 4D, for the sake of clearness, the cleaving member MSC is represented in a cutaway view just to show how it originally "surrounds" the fixed support and has such a section that the two cleavage surfaces forming the reflecting terminations of the laser source are not "obscured", while FIGS. 5B and 5C illustrates both the compression and maximum extension of the springs.

Advantageously, this operation can be carried out inside an equipment for manufacturing semiconductors which is already provided with one or more vacuum environments dedicated, inter alia, to the evaporation of suitable substances at a molecular level and in the strict absence of any atmospheric pollution. As a rule, the transfer of semiconductors through various environments of the equipment occurs by activating a sliding motion, completely carried out inside the equipment, acting on a standard wafer support. Therefore, the metal disc DM has been conveniently designed in the illustrated pattern with a diameter of a wafer (50.8 mm.) and is put on the mobile support and fixed thereto with any means (by coherence, screws, pins, etc.), while the release of the cleaving member MSC can be advantageously realized by contracting the free end of the locking lever SB with a fixed obstacle (e.g. a cam) OF, steady with respect to the environment (see FIG. 5A).

Thus the invention fully achieves the above-mentioned object. In fact, in accordance with the invention, a method and a device are provided for carrying out the single-shot cleavage in ultra-high-vacuum environment of processed semiconductor wafer portions which is free from vacuum-tight problems since the device is set up in atmospheric environment and sprung under vacuum without any feed-through towards the outside. Moreover, the cleavage mechanical stresses are applied by moving the cleaving from the processed side of the wafer portion and the pre-notchings are made all on this side and the wafer is no longer manipulated on the back side thus eliminating all risks of damaging the aligned array of semiconductor lasers on the processed side.

Further, the cleavage device according to the invention is simple in construction and reliable. The shaping of the cleaving member is such that, at the end-of-travel, it surrounds the support-bar-thrust member assembly, holds the cleavage swarfs down and does not obscure the specular and perfect cleavage surfaces thus obtained.

The impulsive aspect of the simultaneous application of stresses in a direction vertical to the wafer portion to be cleaved from the processed side thereof leads to a quick cleavage, such as to obtain the best specular surfaces.

Advantageously, the device in accordance with the invention can operate in ultra-high-vacuum environment such the one existing in equipment already used in semiconductor wafer manufacturing and processing where, thanks to the pattern of the base disc having the standard dimensions of a semiconductor wafer, can be transferred inside such ultra-high-vacuum environment and sprung from the inside thus carrying out the cleavage.

While the invention has been described referring to a specific embodiment thereof, it should be noted that the invention is not to be construed as limited in the illustrated embodiment being susceptible to several modifications and variations which, being apparent to those skilled in the art, are to be understood as falling within the inventive concept.

I claim:

1. A method for making bars of semiconductor lasers from a semiconductor wafer having only one processed side with an aligned array of semiconductor lasers and with pre-notches made on two edges external to the aligned array of semiconductor lasers and formed as cleavage lines, the method comprising the steps of:

holding a central region of the semiconductor wafer on supporting means having dimensions corresponding to a bar to be made so side regions of the semiconductor wafer form ledges extending beyond the supporting means;

applying in an environment having an ultra-high-vacuum cleavage impulsive mechanical stresses to the one processed side of the semiconductor wafer that are perpendicular to the one processed side and correspond with the cleavage lines defined by the pre-notches to make each bar with the aligned array of semiconductor lasers and with swarfs formed by the ledges corresponding to the side regions of the semiconductor wafer.

2. A device for making bars of semiconductor lasers from a semiconductor wafer having only one processed side with an aligned array of semiconductor lasers and with pre-notches made on two edges external to the aligned array of semiconductor lasers and formed as cleavage lines, the device comprising:

a supporting block being fixed on a base and including a cross piece having an upper surface with dimensions that correspond to a bar to be made, for holding on the upper surface a central region of the semiconductor wafer corresponding to the bar to be made, and for leaving side regions of the semiconductor wafer forming ledges extending beyond the supporting block;

a centering thrust member for mating with and being superposable on the fixed supporting block to center and hold the semiconductor wafer, and having a lower side with corresponding dimensions to the upper surface of the cross piece;

a cleaving member having a window shaped to enable the cross piece and centering thrust member to pass through with precision for applying impulsive cleavage mechanical stresses to the one processed side of the semiconductor wafer simultaneously at the pre-notches; and actuating means for moving the cleaving member from an upper position above the semiconductor wafer to a lower position below the semiconductor wafer in an environment having an ultra-high-vacuum, so as to apply cleavage impulsive mechanical stresses simultaneously and perpendicularly to the one processed side of the semiconductor wafer, that correspond with the two cleavage lines defined by the pre-notches, to make the bar with the aligned array of semiconductor lasers and with swarfs formed by the ledges corresponding to the side regions of the semiconductor wafer.

3. A device according to claim 2, wherein the actuating means comprise:

a pair of cylindrical shafts having a first end fixed on the base and extending vertically thereto, designed to slidably support the cleaving member;

a pair of helical springs, each of the helical springs coaxially mounted on a respective one of the pair of cylindrical shafts and having a respective first end acting on an upper side of the cleaving member and a respective second end rigidly fixed to a second corresponding end of each of the pair of cylindrical shafts; and a locking arrangement designed to lock the cleaving member in an upper position and to release the cleaving member.

4. A device according to claim 3, wherein respective second ends of the pair of helical springs are fixed to the pair of cylindrical shafts through respective bushings keyed on and made rigidly fixed to the pair of cylindrical shafts by a 90 degree rotation thereof.

5. A device according to claim 3, wherein the locking arrangement is actuated from the inside of the environment having the ultra-high-vacuum to release the cleaving member.

6. A device according to claim 5, wherein the locking arrangement consists of a two-end lever, rotatably pivoted at a center and having one end designed to hold the cleaving member in an upper position by contacting the cleaving member when the pair of helical springs are compressed.

7. A device according to claim 2, wherein the cross piece of the supporting block has a trapezoidal cross-section having the upper surface corresponding to an upper side of a trapezoid for holding on the upper surface the central region of the semiconductor wafer corresponding to the bar to be made, and having respective ends; and wherein the supporting block includes two prismatic blocks each having a U-shaped flare with a respective bottom surface defining a supporting surface that is raised above the upper surface of the cross piece.

8. A device according to claim 7, wherein the centering thrust member comprises a rectangular cross piece having a lower side and two ends for resting on the supporting surface of each U-shaped flare of the supporting block.

9. A device according to claim 8, wherein the cleaving member is a plate that includes the window and two calibrated holes for slidably receiving a pair of cylindrical shafts.

10. A device according to claim 7, wherein the cleaving member is a plate that includes the window and two calibrated holes for slidably receiving a pair of cylindrical shafts.

11. A device according to claim 2, wherein the semiconductor wafer is a standard semiconductor wafer having a pattern and a diameter; and wherein the base of the supporting block is a metal disc having a corresponding pattern and a corresponding diameter that is substantially similar to the semiconductor wafer.

12. A device according to claim 2, wherein the cleaving member is a plate that includes the window and two calibrated holes for slidably receiving a pair of cylindrical shafts.

\* \* \* \* \*